United States Patent
Cabiri et al.

(10) Patent No.: US 6,493,064 B2
(45) Date of Patent: Dec. 10, 2002

(54) METHOD AND APPARATUS FOR REGISTRATION CONTROL IN PRODUCTION BY IMAGING

(75) Inventors: Oz Cabiri, St. Macabim (IL); Effraim Mikletzki, Jerusalem (IL); Yossef Atiya, St. Maccabim (IL)

(73) Assignee: Creo IL, Ltd., Herzlia Pitvach (IL)

( * ) Notice: Subject to any disclaimer, the term of this patent is extended or adjusted under 35 U.S.C. 154(b) by 23 days.

(21) Appl. No.: 09/793,916

(22) Filed: Feb. 28, 2001

(65) Prior Publication Data

US 2002/0118350 A1 Aug. 29, 2002

(51) Int. Cl.[7] ............................................... G03B 27/42
(52) U.S. Cl. ........................... 355/53; 355/72; 356/399; 356/400; 700/121; 700/193; 101/486
(58) Field of Search ............................. 355/43, 45, 53, 355/54, 72; 356/399, 400, 401; 348/94, 129, 130, 147; 101/486; 700/58, 121, 122, 166, 193, 57, 60

(56) References Cited

U.S. PATENT DOCUMENTS

| | | |
|---|---|---|
| 3,646,336 A | 2/1972 | Hobrough |
| 4,790,694 A | 12/1988 | Wilent et al. |
| 4,829,375 A | 5/1989 | Alzmann et al. |
| 4,999,764 A | 3/1991 | Ainsworth et al. |
| 5,036,574 A | 8/1991 | Kakimoto |
| 5,124,927 A | 6/1992 | Hopewell et al. |
| 5,136,948 A | 8/1992 | Fujino et al. |
| 5,164,742 A | 11/1992 | Baek et al. |
| 5,200,800 A | 4/1993 | Suda et al. |
| 5,230,027 A | 7/1993 | Kikuchi |
| 5,274,394 A | 12/1993 | Corona et al. |
| 5,381,004 A | 1/1995 | Uritsky |
| 5,403,684 A | 4/1995 | Schroeder et al. |
| 5,453,777 A | 9/1995 | Pensavecchia |
| 5,459,941 A | 10/1995 | Lowe |
| 5,500,801 A | 3/1996 | Loffler |
| 5,506,793 A | 4/1996 | Straayer et al. |
| 5,548,372 A | 8/1996 | Schroeder et al. |
| 5,682,243 A | 10/1997 | Nishi |
| 5,699,742 A | 12/1997 | Ahrens et al. |
| 5,754,294 A | 5/1998 | Jones et al. |
| 5,812,407 A | 9/1998 | Sato et al. |
| 5,835,194 A | 11/1998 | Morton |
| 5,894,350 A | 4/1999 | Hseih et al. |
| 5,920,481 A | 7/1999 | Ichihara et al. |
| 5,980,088 A | 11/1999 | Iwasaki et al. |
| 5,980,194 A | 11/1999 | Freeks et al. |
| 5,985,680 A | 11/1999 | Singhal et al. |
| 6,043,865 A | 3/2000 | Halup et al. |
| 6,205,364 B1 | 3/2001 | Lichtenstein et al. |

OTHER PUBLICATIONS

Laser Direct Imaging for Precise Positioning of Circuitry with HDI/Micro Vias and SBU Technologies, Guenther Enne, et al, TPCA 2000 Forum Proceedings, Nov. 23–25, 2000, pp. 377–384.

*Primary Examiner*—D. Ruthledge
(74) *Attorney, Agent, or Firm*—G. E. Erlich Ltd.

(57) ABSTRACT

A method and apparatus for imaging an overlying conductive pattern over an underlying conductive pattern on a substrate, by determining deviations between the actual locations and the nominal locations of predetermined reference targets in the underlying conductive pattern on the substrate; and utilizing the determined deviations for modifying the scanning control data used for imaging the image data of the overlying conductive pattern in order to reduce misregistration thereof with respect to the underlying conductive pattern. Preferably, the reference targets are predetermined connection sites in the underlying conductive pattern to be precisely located with respect to connection sites in the overlying conductive pattern. The reference features may be assigned different weights according to their registration importance, and the deviations may be determined according to a threshold which varies with the weight assigned to the respective reference feature.

30 Claims, 7 Drawing Sheets

METHOD AND APPARATUS FOR REGISTRATION CONTROL IN PRODUCTION BY IMAGING

FIELD AND BACKGROUND OF THE INVENTION

The present invention relates to registration control in various production methods that use imaging. This includes, but is not limited to, Electronics Components (ELC), Flat Panel Displays (FPD), various conductive and non-conductive patterns or holes on/in PCBs, masks for soldering, plating, etching or plasma etching, or hole plug curring. The invention is particularly useful in producing multi-layer PCBs in accordance with the laser direct imaging (LDI) process, and is therefore described below particularly with respect to this process.

Multi-layer PCBs (sometimes referred to as PWBs or printed wiring boards) are widely used in electronic systems. Such PCBs may include as many as 20 or 30 layers, each having its own electrically conductive pattern, with various layers electrically connected together by interlayer connections, such as pins, posts, plated-through-holes (PTHs), pads and the like. The interlayer registration of the conductive patterns is of critical importance and becomes increasingly problematical as the dimensions of the conductive patterns decrease in size, and as the panels increase in size to improve productivity.

In the conventional phototool process for producing PCBs, each layer is imaged via a phototool film on a photoresist layer. As the dimensional tolerances of the conductive patterns become tighter, not only must the phototools be made to the tighter tolerances, but these tolerances must also be maintained throughout the lifetime of the phototool. However, phototools of the plastic type tend to change in dimensions with changes in temperature and/or humidity, and phototools of the glass plate type are expensive and hard to handle.

As a result, imagining processes based on laser direct imaging (LDI) have become increasingly used. In LDI processes, the conductive pattern is imaged directly on the photoresist by lasers. Each conductive pattern is defined by image data, e.g., from a CAM file, to be applied on the photoresist according to scanning control data which controls the relative movements between the laser exposure head and the substrate. However, the positional and dimensional accuracy, and the repeatability of image placement on the photoresist, become critical.

It is therefore common to use fiducials, (i.e., references) for precise registration of the patterns in the various layers. To provide positional accuracy in the various layers, the deviations between the actual locations and the nominal locations of such fiducials are determined and used to calculate position and scaling factors, which are in turn used for correcting the locations of the image data. Examples of known techniques for providing accuracy are described in U.S. Pat. Nos. 5,894,350; 5,506,793; 5,548,372; 5,403,684; 5,381,004; 5,200,800; 5,682,243 and 5,980,088, and the publication titled "Laser Direct Imaging for Precise Positioning of Circuitry with HDI/MicroVias and SBU Technologies, by Guenther Enne, et al., TPCS 2000 Forum Proceedings, Nov. 23–25, 2000, pp 377–384. However, if such correction factors are produced and used for correcting the locations of each image data in each layer, the required database and processing time would both be extremely large.

A broad object of the present invention is to provide another method of registration control between the layers in a multi-layer PCB. Another object is to provide a method of imaging an overlying conductive pattern over an underlying conductive pattern in order to reduce misregistration; and a further object of the invention is to provide an improved method of making a PCB by LDI (laser direct imaging) enabling a high degree of registration control to be attained.

BRIEF SUMMARY OF THE PRESENT INVENTION

According to one aspect of the present invention, there is provided a method of imaging an overlying pattern over an underlying pattern on a substrate, each pattern being defined by image data to be applied at nominal (i.e., theoretical or desired) locations according to scanning control data, the method comprising: determining deviations between the actual locations, and the nominal locations of predetermined reference targets of the underlying conductive pattern on the substrate; and utilizing the determined deviations for modifying the scanning control data used for imaging the image data of the overlying conductive pattern in order to reduce misregistration thereof with respect to the underlying conductive pattern.

As will be described more particularly below, such a method enables each conductor pattern layer to be registered with respect to its preceding conductive layer, without requiring an inordinate database or processing time, since the determined deviations are utilized to modify the scanning control data, rather than the image data file.

According to further features in the described preferred embodiment, the reference targets are predetermined features, preferably predetermined connection sites, in the underlying conductive pattern. Thus, instead of using two, three or four fiducials as the reference targets for registration purposes, as characteristic of the prior art, the novel method enables a much larger number of reference targets to be used, thereby enhancing the overall registration process. Also, since the electrical connections are made through the layers at the connection sites, selecting connection sites as the reference targets for registration purposes better assures accurate registration at the critical locations where the interlayer electrical connections are to be made, and increases the level of misregistration tolerated by the process.

The underlying conductive pattern used for determining the deviations between the actual and the nominal (i.e., the theoretical or desired) locations of the predetermined reference targets would usually be the one in the immediately underlying layer, but could also be one in a more distant underlying layer particularly if electrical connections are to be made from that layer to the overlying conductive pattern to be applied.

According to further features in the described preferred embodiment, the predetermined features selected as reference targets may be assigned different weights according to their registration tolerances, and the deviations may be determined according to a threshold which varies with the weight assigned to the respective reference target. This feature also increases the level of misregistration tolerated by the process.

According to still further features in the described preferred embodiment, each of the conductive patterns includes a global area having predetermined reference targets, and one or more local areas each having predetermined reference targets; the reference targets in the global area of the underlying conductive pattern being used for imaging the local area of the overlying conductive pattern with respect to the underlying conductive pattern; the determined deviations in the reference targets in the local area of the underlying conductive pattern being used for modifying the scanning control data to reduce misregistration of the imaged local area of the overlying conductive pattern with respect to the underlying conductive pattern.

According to another aspect of the present invention, there is provided a method of making a PCB having a plurality of layers containing conductive patterns overlying each other and to be precisely located with respect to each other, the method comprising: applying each layer by an LDI process in which each conductive pattern is defined by image data to be applied at nominal locations according to scanning control data; determining deviations between the actual locations and the nominal locations of predetermined reference targets of each conductive pattern on a substrate before the overlying conductive pattern is applied thereover; and utilizing the determined deviations for modifying the scanning control data used for imaging the image data of each overlying conductive pattern in order to reduce misregistration thereof with respect to its respective underlying conductive pattern.

According to a still further aspect of the invention, there is provided apparatus for imagining conductive patterns on a substrate, comprising: a holder for holding the substrate; an imaging device for imaging at least two conductive patterns in overlying relationship to each other on the substrate, each conductive pattern being defined by image data to be applied at nominal locations on the substrate according to scanning control data; scanning means for effecting relative movement between the substrate and the imaging device according to the scanning control data for the respective conductive pattern; a sensor for sensing the actual locations of predetermined reference targets of an underlying conductive pattern on the substrate before an overlying conductive pattern is applied thereover; and a controller programmed to determine deviations between the actual locations and the nominal locations of predetermined reference targets of an underlying conductive pattern on the substrate and to utilize the determined deviations for modifying the scanning control data used for imaging the image data of the overlying conductive pattern in order to reduce misregistration thereof with respect to the underlying conductive pattern.

Further features and advantages of the invention will be apparent from the description below.

BRIEF DESCRIPTION OF THE DRAWINGS

The invention is herein described, by way of example only, with reference to the accompanying drawings, wherein.

DESCRIPTION OF A PREFERRED EMBODIMENT

Figure 1:
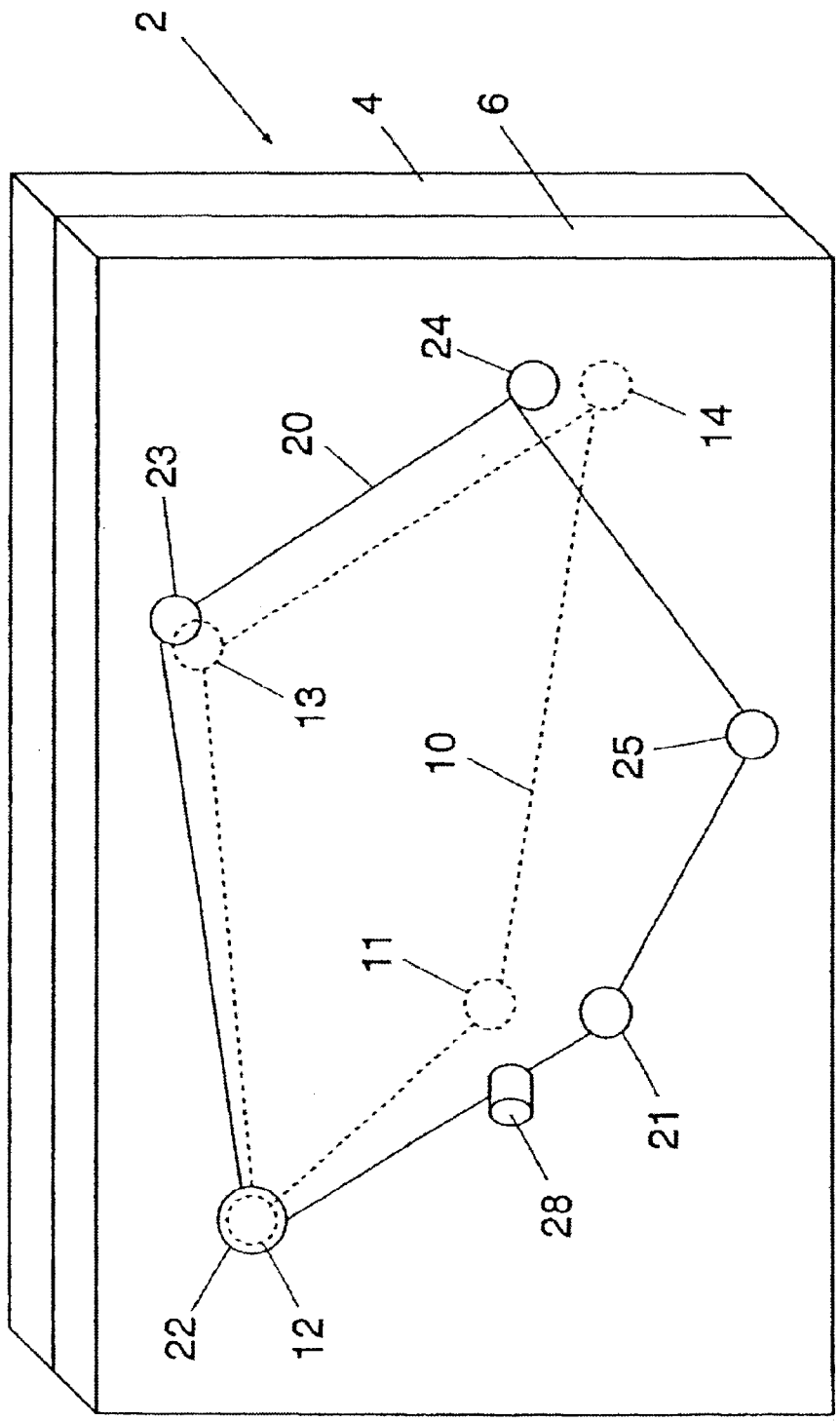
FIG. 1 schematically illustrates two overlying layers of a PCB and exaggerated examples of various possible misregistrations at connection sites in their respective conductive patterns.

With reference first to FIG. 1, this figure shows only two layers of a multi-layer PCB 2, namely an underlying layer 4, and an overlying layer 6. The underlying layer 4 is formed with a conductive or non-conductive pattern, schematically shown by broken lines 10, including a plurality of connection sites 11, 12, 13, and 14, respectively. The overlying layer 6 to be formed thereover also includes a conductive pattern, schematically shown by full lines 20, having a plurality of connection sites 21, 22, 23, 24 and 25, respectively.

As seen in FIG. 1, connection site 12 of the underlying conductive pattern 10 is in perfect registration with connection site 22 in the overlying pattern 20, so that a conductive pin, such as schematically shown at 28, may be passed through a hole formed through the connection sites 12, 22, to make an electrical connection between the two conductive patterns 10, 20 at these connection sites. While FIG. 1 illustrates the connection to the two conductive patterns as being made by a pin 28, it will be appreciated that the connection could also be made by other means, e.g., by a plated-through-hole (PTH), or by a pad.

Connection site 23 in the overlying pattern 20 is not in perfect registration with connection site 13 of the underlying pattern 10, but sufficiently overlaps that connection site such that a pin or PTH centered in one will also be in contact with the other. The two connection sites 13, 23 thus illustrate an example of misregistration which is tolerated by the process.

Connection sites 14 and 24 in the two conductive patterns illustrate an example of misregistration not tolerated by the process, since a pin or PTH passing through one will not make electrical contact with the other. Such a misregistration, therefore, could result in a faulty PCB. The same applies also with respect to connection sites 11 and 21 which are even more misregistered.

The method of the present invention, as described more particularly below, is intended "to fit" the overlying pattern 20 over the underlying pattern 10 so as to avoid misregistrations, such as illustrated by connection sites 14, 24 and 11, 21, and to do this in a manner which does not require the location of each data element of the imaged file for the overlying conductive pattern to be corrected.

Figure 2:
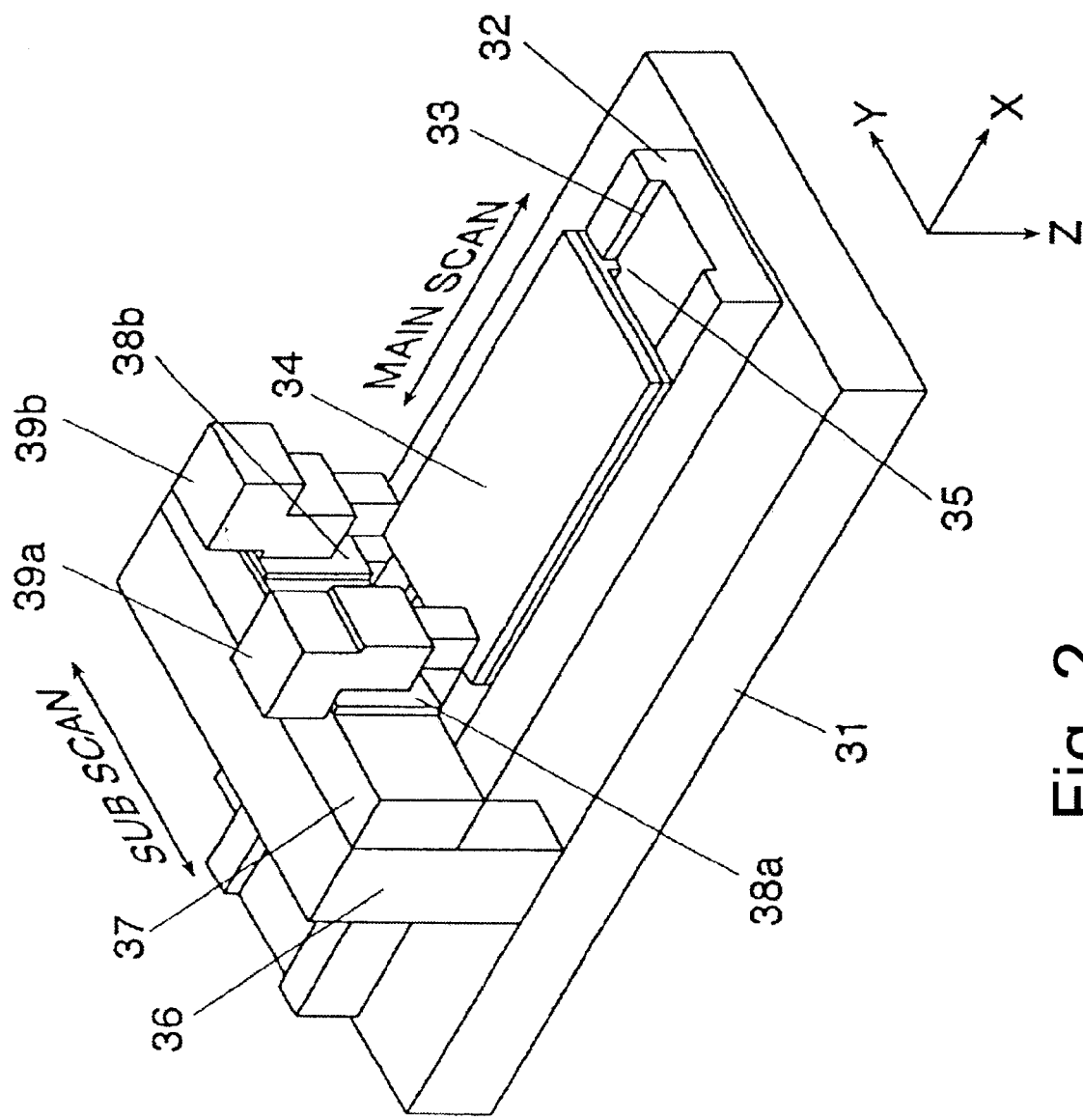
FIG. 2 illustrates one form of apparatus that may be used in the method of the present invention for producing PCBs.

FIG. 2 illustrates one form of apparatus that may be used for practicing the novel method. The illustrated apparatus includes a granite base 31 formed with a table 32 having a longitudinal guideway 33 extending along the longitudinal axis of the apparatus, namely the X-axis. The apparatus further includes a chuck 34 for holding the substrate or panel used for making the PCB. Chuck 34 is formed with a pair of parallel ribs 35 on its lower surface movable within guideway 33 for guiding the movement of the chuck, and thereby of the panel held thereon, for longitudinal movement along the X-axis.

The illustrated apparatus further includes a bridge 36 supported on the granite base 31 and extending transversely across the table 32 and the chuck 34. A mounting member 37 is secured to the upper portion of the bridge 36 and mounts two slides 38, 38b, each carrying an exposure head 39a, 39b, over the chuck 34, and the panel (not shown) carried by the chuck. Each of the exposure heads 39a, 39b is movable in the Y-axis, namely transversely of the chuck 34 and the panel carried thereby, and also along the Z-axis, namely towards and away from the chuck and the panel carried thereby.

Figure 3:
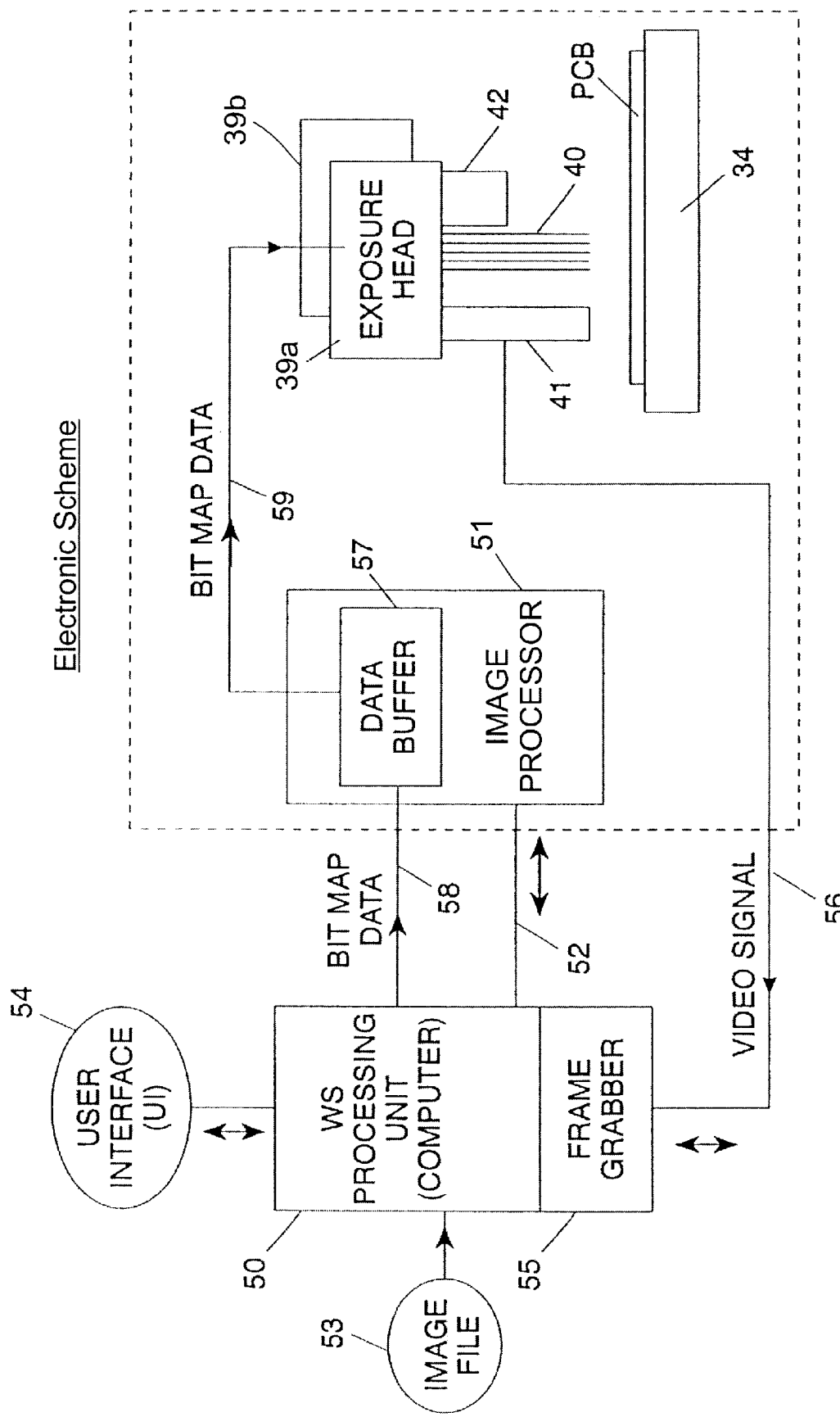
FIG. 3 is a block diagram illustrating the electronic system used with the apparatus of FIG. 2.

FIG. 3 schematically illustrates the structure of each of the exposure heads 39a, 39b. Thus, the exposure head shown in FIG. 3, and therein designated 39, includes a linear array of lasers 40, defining individually controlled pixels of the image to be printed on the PCB supported on chuck 34.

An electronic camera 41 is fixed to the exposure head 39 so that it moves with it. Camera 41 has a field of view which covers only a relatively small portion of the surface of the panel PCB in order to provide high resolution in a relatively compact camera. The camera is fixed to the exposure head such that a reference point of the camera field of view is at a known location with respect to a reference point of the exposure head, and thereby, of the lasers 40 producing the laser writing beams. Camera 41 is used as a sensing device to snap features on the panel in order to sense reference targets thereon. As will be described more particularly below, camera 41 is used to sense the actual locations of certain reference targets on the panel PCB in terms of the machine exposure head coordinates, in order to enable a determination to be made as to the deviations of the actual locations of those reference targets with respect to their nominal locations as defined in the respective image file.

Exposure head 39 further carries an autofocus device 42. This device measures the distance between the exposure head and the outer surface of the panel PCB, by means well known in the art, in order to maintain the printing laser beams from the lasers 40 in focus with the outer surface of the panel. Autofocus device 42 may also be used for continuously controlling the lasers 40 to compensate for variations in the thickness of the panel PCB.

As further shown in FIG. 3, the electrical system includes two main processing units: a workstation (WS) processor 50 located in the workstation outside of the imager; and an imager processor 51 located on the imager. The two processors communicate with each other via a two-directional path 52.

WS processor 50 is the main control unit. It receives inputs from the image file 53 and the user interface 54, and controls the lasers 40 and the camera 41 carried by the exposure head 39 in accordance with these inputs. A frame grabber 55 within the WS processor 50 grabs the video signal frame from camera 41 received via line 56, and converts it to a graphic file.

As will be described more particularly below, the WS processor 50 identifies certain features in the grabbed frame as reference targets. It also determines any deviations in the actual locations of such reference targets with respect to their nominal (i.e., theoretical or desired) locations as defined in the image file 53, and calculates the correction factors for fitting the actual locations to the nominal locations. However, instead of applying these correction factors to the data derived from the image file 53 for the overlying conductive pattern, these correction factors are utilized instead to modify the scanning control data used for imaging the image data of the overlying conductive pattern in order to reduce misregistration thereof with respect to the underlying conductive pattern.

The image processor 51 includes a data buffer 57 which receives the data from the WS processor 50. The WS processor 50 converts the image file 53 to a bit-map file which is sent through a dedicated path 58 to the data buffer 57 of the image processor 51. The latter processor sends the data via a path 59 to the exposure head 39 to control the lasers 40.

Figure 4:
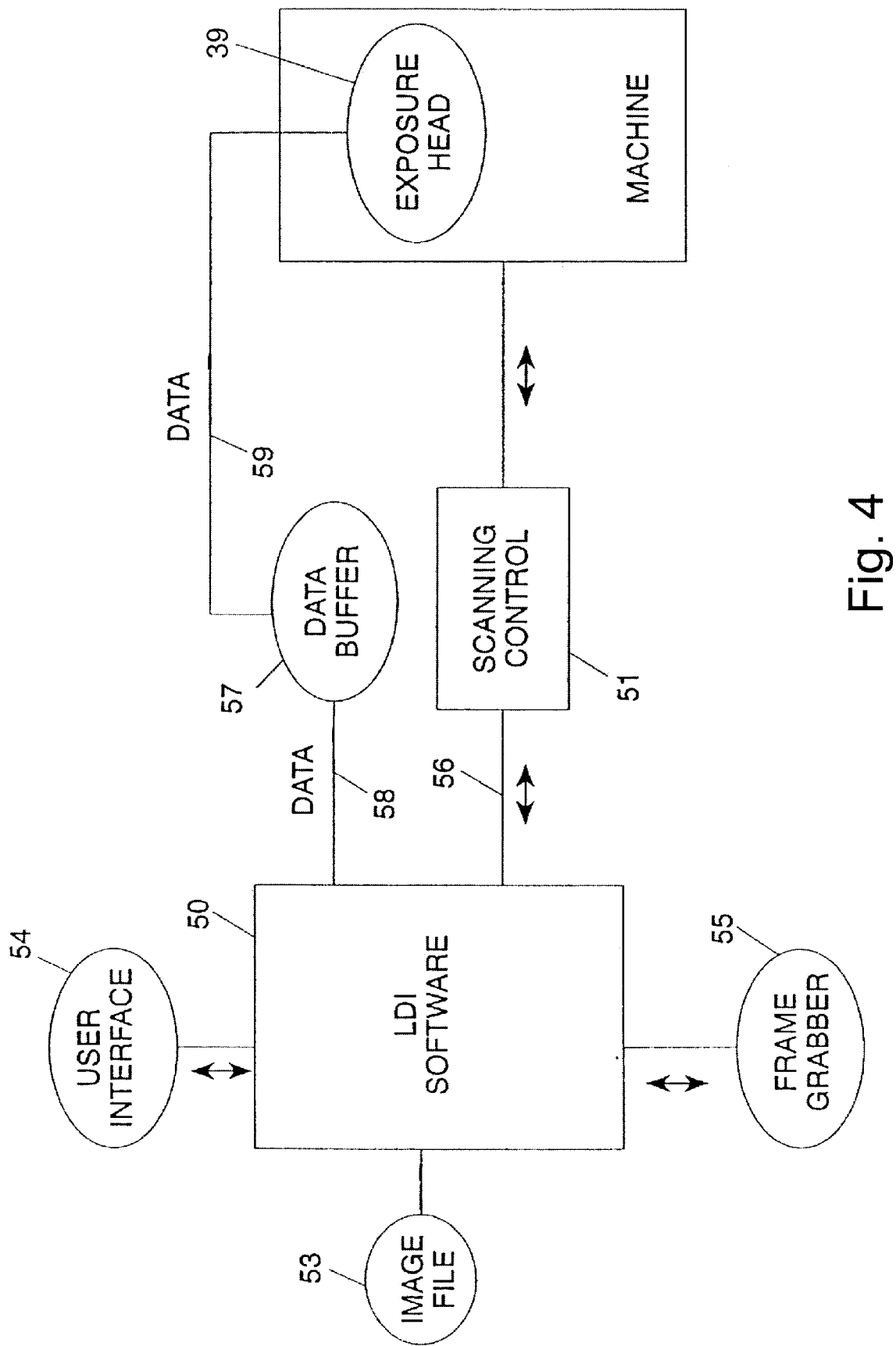
FIG. 4 is a block diagram illustrating the flow of data when using the apparatus of FIGS. 2 and 3.

FIG. 4 illustrates the flow of the data between the WS workstation processor 50, the imager processor 51, and the exposure head 38. As shown particularly in FIG. 4, the workstation WS operations are governed by the LDI (laser direct imaging) software within the WS processor 50; and the actions of the lasers 40 carried by the exposure head 38 are governed by the imager processor 51, which processor also receives the feedback from the exposure head.

As indicated earlier, each conductive pattern imaged on the panel PCB is defined by image data derived from the respective image file 53. Such image data is to be applied at nominal or desired locations of the respective layer on the PCB according to scanning control data which produces relative movement between the exposure head and the PCB along two orthogonal axis to scan the complete surface of the PCB.

Figure 5:
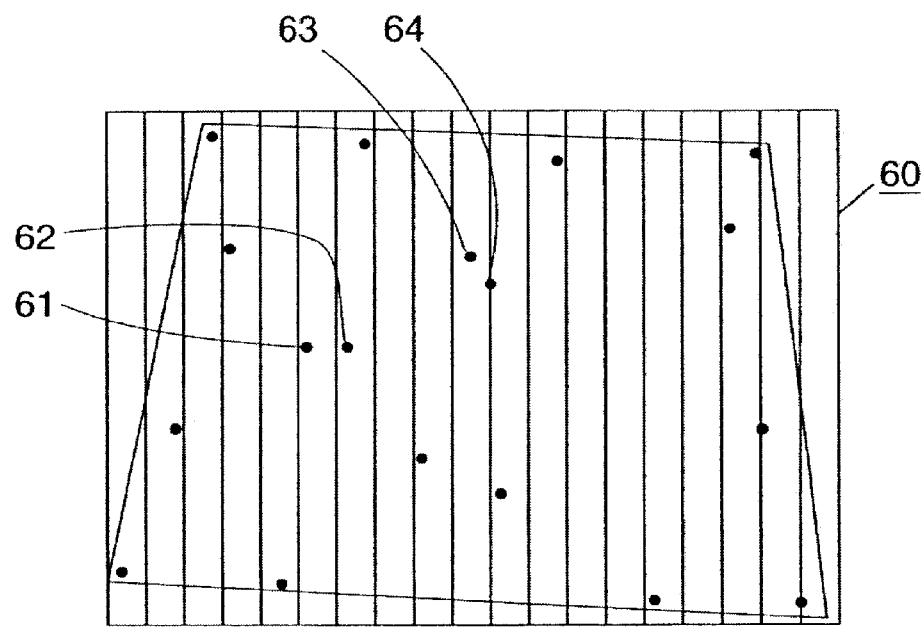
FIG. 5 illustrates a conventional scanning raster normally used with the apparatus of FIG. 2.

FIG. 5 illustrates a typical scanning raster used by the apparatus of FIG. 2 for applying the image data. Such a scanning raster normally traces a plurality of straight parallel lines extending transversely of the PCB along the Y-axis, and spaced longitudinally of the PCB along the X-axis.

In prior art registration systems, the scanning raster illustrated at 60 in FIG. 5 is not modified, but rather the image data itself is modified by the correction factors determined by the sensed deviations between the actual and the nominal or desired locations of predetermined reference targets, in order to correct for misregistration between the two layers.

Thus, if point 61 in FIG. 5 indicates a nominal location of a point to be plotted as specified by the respective image file, and point 62 indicates the actual location of the point as sensed by the camera 41 (or 141), the WS processor 50 would not only calculate the appropriate correction factor, but would also modify the image file 53 to incorporate that correction, so that the bitmap thereafter produced by the image file will include the correction factor.

According to the method of the present invention, however, such correction factors are not used for correcting the data in the image file 53, but rather are used for modifying the scanning control data, to reduce misregistration of an overlying conductive pattern with respect to an underlying conductive pattern.

Figure 6:
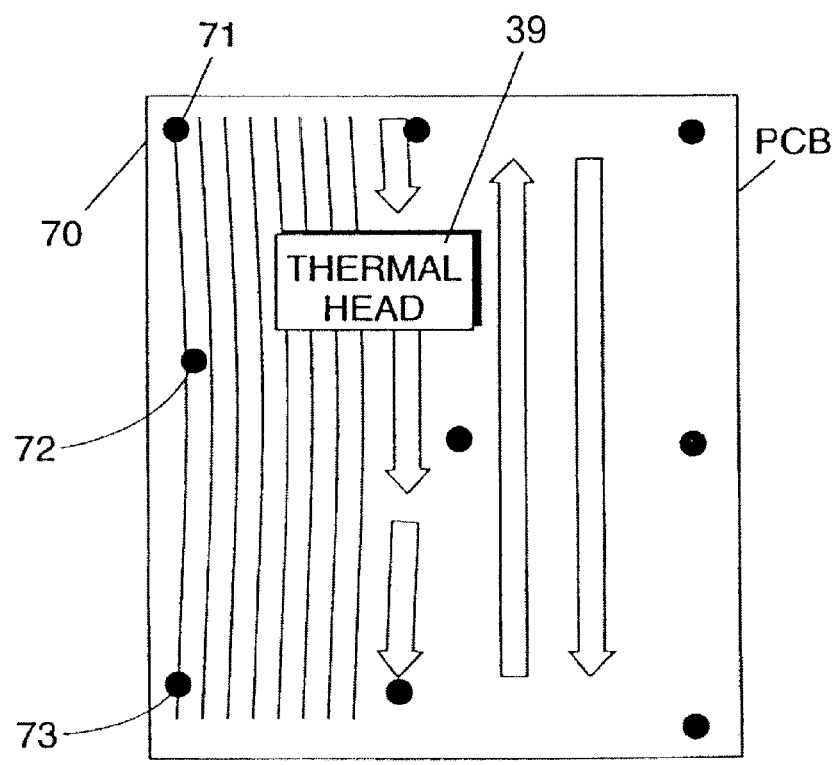
FIG. 6 illustrates the manner of utilizing the determined correction factor for modifying the scanning raster in accordance with the present invention to reduce misregistrations.
Figure 7:
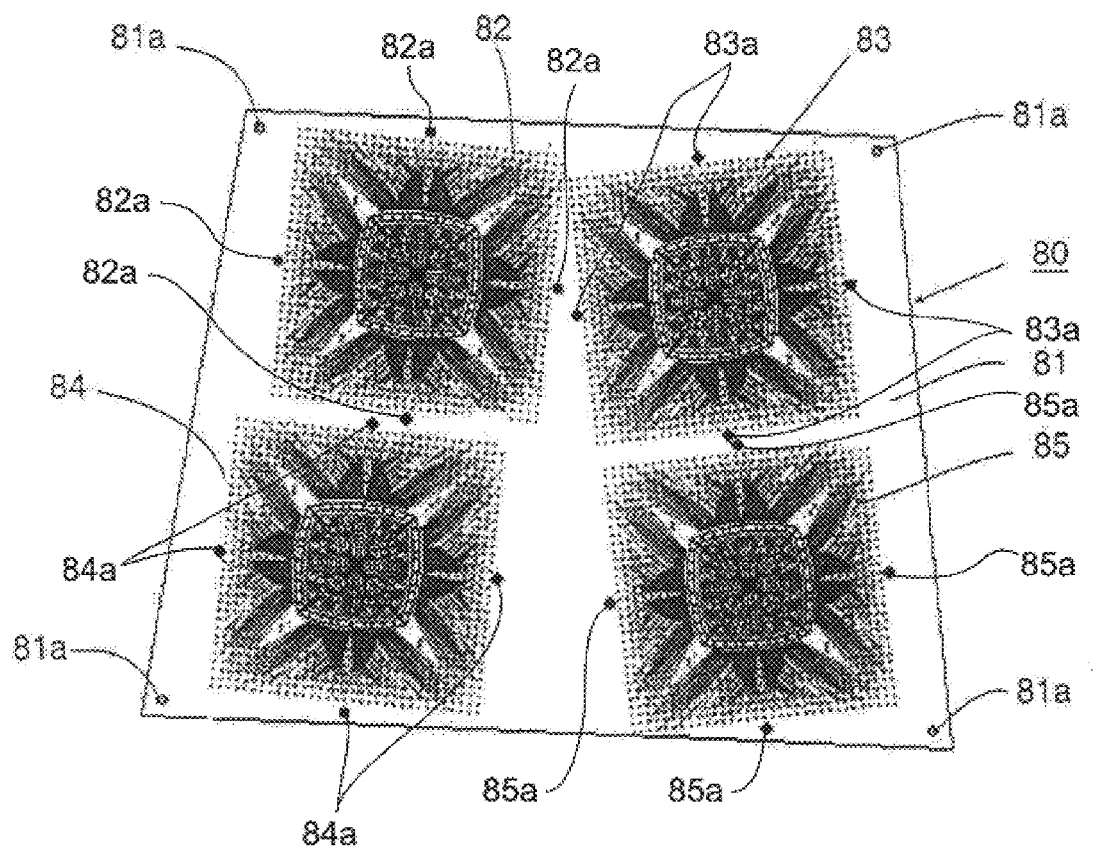
FIG. 7 illustrates the manner in which the method of the present invention may also be used with respect to large panels having a global area with predetermined reference targets, and several local areas also having predetermined reference targets.

Thus, FIG. 6 illustrates a typical scanning raster, generally designated 70, modified in accordance with the present invention to reduce misregistration of an overlying conductive pattern to be applied over an underlying conductive pattern. It will be seen that the transverse and longitudinal scanning lines in FIG. 7 are not straight parallel lines, but rather are curved lines, since they are modified by the correction factors. As described above, these correction factors are determined by the deviations between the actual locations and the nominal desired locations of predetermined reference targets in the underlying conductive pattern.

Thus, as shown in FIG. 6, a modified scanning raster 70 is produced, based on the determined correction factors, and is used for controlling the transverse movements of the exposure head 38 during the longitudinal movement of the panel PCB. The scanning raster is modified such that those reference targets, e.g., as schematically shown at 71, 72, 73, which are in the same scanning line when in their nominal or desired locations, but are actually sensed to be offset from the respective scanning line, will be included in the modified scanning line.

It will be appreciated that when the scanning lines are so modified, for correcting the deviations in the actual locations of the image points as sensed by the camera, as compared to their nominal locations as inputted from the image file, the same corrections will also be applied to the data points in the image file, thereby reducing the misregistration errors.

It will also be appreciated that using the technique of scan control for effecting registration, it is necessary to scan only a rather small number of points, for example 5×6, 10×10, or 100×100, while effecting registration by manipulating the image data involves handling much larger quantities of data, in the wide range for most applications.

The correction factors to be calculated would include the position offset factors in the X-axis and Y-axis, the scaling factors in the X-axis and Y-axis, the rotation factor, and the rotation of the head or panel holding chuck in the runtime to account for the curved lines along the Y-axis.

As indicated above, the features in the conductive patterns used as the reference targets for determining the correction factors are preselected connection sites in the (or in an) underlying conductive pattern which are to be precisely aligned with respect to connection sites in the overlying conductive pattern to enable electrical connections to be made to both patterns by pins or PTHs passing through both layers. Such a technique enables a large number of predetermined connection sites to be used as the reference targets in registering the two conductive patterns. It also better assures more precise registration at the locations of the two conductive patterns which are the most sensitive to registration errors.

Another advantage in this technique is that it permits the reference targets, i.e., the predetermined connection sites, to be assigned different weights according to their importance to precise registration, and thereby enables a varying threshold, varying according to such weights, to be applied in determining whether a particular deviation requires correction or not.

FIG. 7 illustrates a still further advantage in the described registration method, in that it enables large panels to be imaged with local registration without losing continuation of the images. Thus, FIG. 7 illustrates a large panel, generally designated 80, including a global area 81 and a plurality of local areas 82–85. The global area 81 includes a plurality of predetermined reference targets of fiducials 81a; and each of the local areas 82–85 also includes a plurality of reference targets or fiducials as shown at 82a–85a, respectively.

The deviations, as determined according to the above-described technique, in the actual reference targets 81a with respect to the desired or nominal reference targets 81a in the global area 81 of the underlying conductive pattern, may be used for positioning the local areas 82–85 of the overlying conductive pattern with respect to the underlying conductive pattern; and the determined deviations in the reference targets 82a–85a between the actual locations and the desired locations in the underlying conductive pattern may be used for modifying the scanning control data for imaging the local areas of the overlying conductive pattern.

Figure 8:
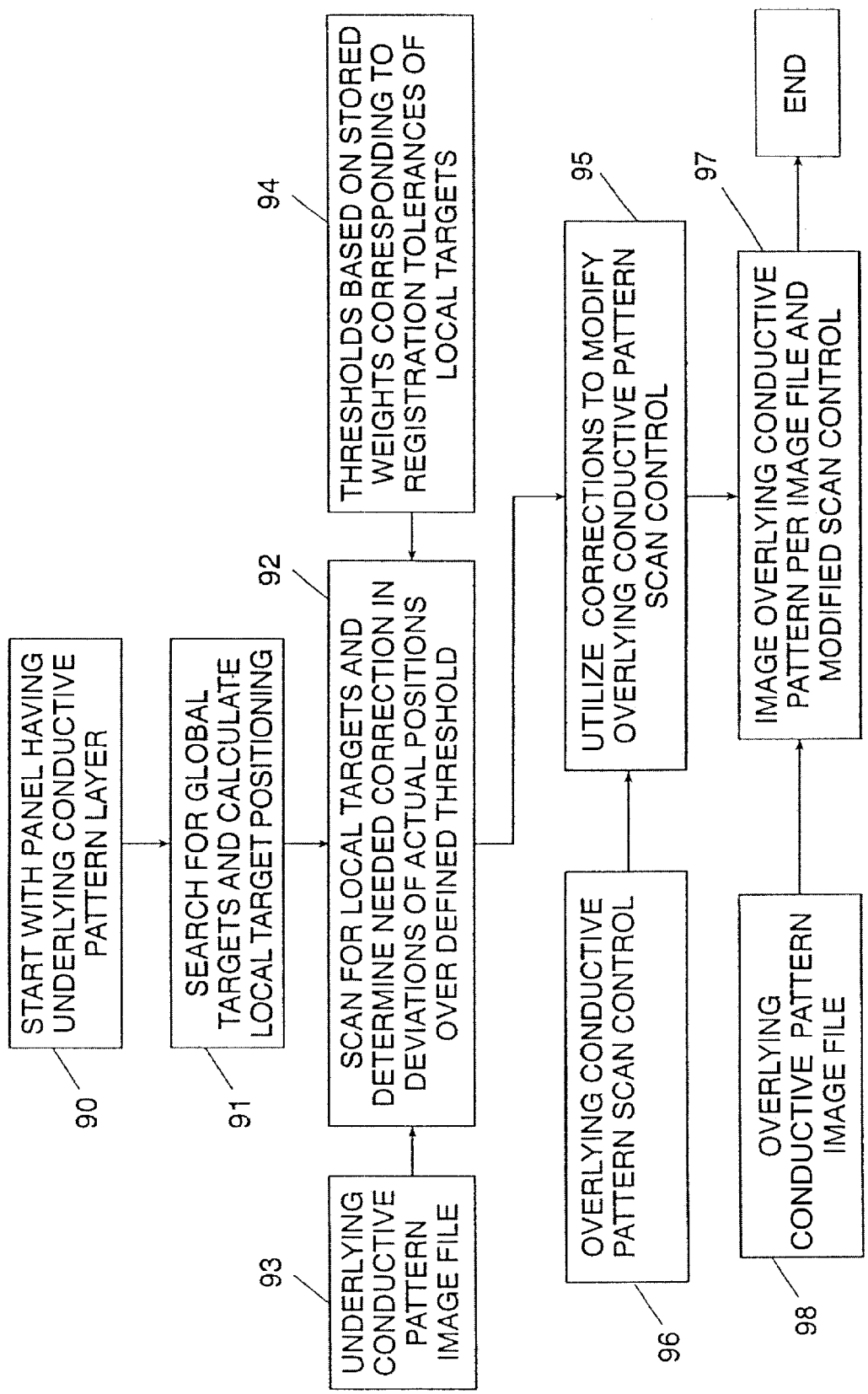
FIG. 8 is a flow chart illustrating one manner of imaging an overlying conductive patterns to reduce misregistration thereof with respect to its underlying conductive pattern in accordance with the present invention.

FIG. 8 is a flow chart illustrating one manner of imaging an overlying conductive pattern over an underlying conductive pattern in accordance with the above-described method in order to reduce registration errors.

The flow chart of FIG. 8 starts with a panel having an underlying conductive pattern layer received on the chuck 34 in the apparatus of FIG. 2, preparatory to the application of the image of the overlying conductive pattern (block 90).

The system first searches for global targets, such as shown at 71a in FIG. 7, and calculates the local target position (block 91).

The system then scans for local targets, such as shown at 72a–75a in FIG. 7, and senses, via the camera (41, FIG. 3), the actual positions of the local targets (block 92). At the same time, the system compares the actual positions of the local targets with their desired nominal positions as received from the image file of the underlying conductive pattern (block 93), and determines the corrections needed to reduce the registration errors between the actual locations and the desired locations. In determining the needed corrections, the system utilizes, as the threshold for each local target, the weight assigned to that target as previously determined according to the registration tolerance permitted by that target (block 94).

The corrections so produced, as shown in block 92 are utilized to modify the scan control for the overlying conductive pattern (block 95) as received from the overlying conductive pattern scan control (block 96). The overlying conductive pattern is then imaged (block 97) according to the image file of the overlying conductive pattern (block 98) and the modified overlying conductive pattern scan control from block 95.

As described above, the reference targets whose positions are used for indicating the registration errors and thereby for determining the correction factors, are preferably predetermined features in the (or in an) underlying conductive pattern selected as reference targets, and more particularly, predetermined connection sites in the underlying conductive pattern to be precisely located with respect to connection sites in the overlying conductive pattern for electrical connection by pins, PTHs, etc. However, in some applications of the invention, e.g., where the reference targets are weighted according to their importance to registration, or where they are used in global areas to locate locals areas, they may be fiducials or markings commonly applied to the panels for registration control purposes.

While the invention has been described with respect to a preferred embodiment, it will be appreciated that this is set forth merely for purposes of example, and that many other variations, modifications and applications of the invention may be made.

What is claimed is:

1. A method of imaging an overlying pattern over an underlying pattern on a substrate, each pattern being defined by image data to be applied at nominal locations according to scanning control data, said method comprising:

determining deviations between the actual locations and the nominal locations of predetermined reference targets of the underlying conductive pattern on the substrate;

and utilizing said determined deviations for modifying the scanning control data used for imaging the image data of the overlying conductive pattern in order to reduce misregistration thereof with respect to the underlying conductive pattern.

2. The method according to claim 1, wherein said predetermined reference targets are predetermined features in the underlying conductive pattern selected as reference targets.

3. The method according to claim 1, wherein said predetermined reference targets are predetermined connection sites in the underlying conductive pattern to be precisely located with respect to connection sites in the overlying conductive pattern.

4. The method according to claim 1, wherein said reference targets are assigned different weights according to their registration tolerances, and said deviations are determined according to a threshold which varies with the weight assigned to the respective reference target.

5. The method according to claim 1, wherein each of said conductive patterns includes a global area having predetermined reference targets, and a local area having predetermined reference targets; the reference targets in the global area of the underlying conductive pattern being used for imaging the local area of the overlying conductive pattern with respect to the underlying conductive pattern; the determined deviations in the reference targets in the local area of the underlying conductive pattern being used for modifying the scanning control data to reduce misregistration of the imaged local area of the overlying conductive pattern with respect to the underlying conductive pattern.

6. The method according to claim 1, wherein each of said conductive patterns is imaged by directly imaging a photoresist layer with imaging data applied according to scanning control data for the respective pattern.

7. The method according to claim 1, wherein said scanning control data produces relative movement between an exposure head and the substrate along two orthogonal axes to scan the surface of the substrate for imaging the respective conductive pattern with the respective imaging data.

8. The method according to claim 7, wherein said substrate is mounted on a flat holder.

9. The method according to claim 8, wherein said exposure head includes one or more lasers.

10. The method according to claim 8, wherein said flat holder is driven longitudinally, and said exposure head is driven transversely, under the control of said scanning control data to scan the surface of the substrate on said flat holder.

11. A method of imaging an overlying conductive pattern over an underlying conductive pattern on a substrate, each conductive pattern being defined by image data to be applied at nominal locations according to scanning control data, said method comprising:
    selecting a plurality of features on said underlying conductive pattern to serve as reference targets;
    sensing the actual locations of said reference targets on said underlying conductive pattern while the substrate is carried by a holder;
    determining deviations in the sensed actual locations of said reference targets on said underlying conductive pattern with respect to the nominal locations of the reference targets in the underlying conductive pattern;
    and modifying said scanning control data of the overlying conductive pattern in accordance with said deviations to reduce misregistration of the overlying conductive pattern with respect to the underlying conductive pattern.

12. The method according to claim 11, wherein said reference targets are connection sites on the underlying conductive pattern to be precisely aligned with, and electrically connected to, corresponding connection sites on the overlying conductive pattern.

13. The method according to claim 11, wherein said reference targets are assigned different weights according to their registration tolerances, and said deviations are determined according to a threshold which varies with the weight assigned to the respective reference targets.

14. The method according to claim 11, wherein each of said conductive patterns includes a global area having predetermined reference targets, and a local area having predetermined reference targets; the reference targets in the global area of the underlying conductive pattern being used for imaging the local area of the overlying conductive pattern with respect to the underlying conductive pattern; the determined deviations in the reference targets in the local area of the underlying conductive pattern being used for modifying the scanning control data to reduce misregistration of the local area of the overlying conductive pattern with respect to the underlying conductive pattern.

15. The method according to claim 11, wherein each of said conductive patterns is imaged by directly imaging a photoresist layer with imaging data applied according to scanning control data for the respective pattern.

16. The method according to claim 11, wherein said substrate is mounted on a flat holder, and said exposure head includes one or more lasers for imagining the conductive pattern, and a camera for sensing the actual locations of said tolerance targets.

17. A method of making a PCB having a plurality of layers containing conductive patterns overlying each other and to be precisely located with respect to each other, said method comprising:
    applying each layer by an LDI process in which each conductive pattern is defined by image data to be applied at nominal locations according to scanning control data;
    determining deviations between the actual locations and the nominal locations of predetermined reference targets of each conductive pattern on a substrate before the overlying conductive pattern is applied thereover;
    and utilizing said determined deviations for modifying the scanning control data used for imaging the image data of each overlying conductive pattern in order to reduce misregistration thereof with respect to its respective underlying conductive pattern.

18. The method according to claim 17, wherein said predetermined reference targets are predetermined features in the underlying conductive pattern selected as reference targets.

19. The method according to claim 17, wherein said predetermined reference targets are predetermined connection sites in the underlying conductive pattern to be precisely located with respect to connection sites in the overlying conductive pattern.

20. The method according to claim 17, wherein said reference targets are assigned different weights according to their registration tolerances, and said deviations are determined according to a threshold which varies with the weight assigned to the respective reference target.

21. Apparatus for imaging conductive patterns on a substrate, comprising:
    a holder for holding the substrate;
    an imaging device for imaging at least two conductive patterns in overlying relationship to each other on said substrate, each conductive pattern being defined by image data to be applied at nominal locations on the substrate according to scanning control data;
    scanning means for effecting relative movement between the substrate and the imaging device according to the scanning control data for the respective conductive pattern;
    a sensor for sensing the actual locations of predetermined reference targets of an underlying conductive pattern on the substrate before an overlying conductive pattern is applied thereover;
    and a controller programmed to determine deviations between the actual locations and the nominal locations of predetermined reference targets of an underlying conductive pattern on the substrate and to utilize said determined deviations for modifying the scanning control data used for imaging the image data of the overlying conductive pattern in order to reduce misregistration thereof with respect to the underlying conductive pattern.

22. The apparatus according to claim 21, wherein said predetermined reference targets are predetermined features in the underlying conductive pattern selected as reference targets.

23. The apparatus according to claim 21, wherein said predetermined reference targets are predetermined connection sites in the underlying conductive pattern to be precisely located with respect to connection sites in the overlying conductive pattern.

24. The apparatus according to claim 21, wherein said reference targets are assigned different weights according to their registration tolerances, and said controller determines said deviations according to a threshold which varies with the weight assigned to the respective reference target.

25. The apparatus according to claim 21, wherein each of said conductive patterns includes a global area having predetermined reference targets, and a local area having predetermined reference targets; said controller utilizing the reference targets in the global area of the underlying conductive pattern for imaging the local area of the overlying conductive pattern with respect to the underlying conductive pattern; said controller utilizing the determined deviations in the reference targets in the local area of the underlying conductive pattern for modifying the scanning control data to reduce misregistration of the imaged local area of the overlying conductive pattern with respect to the underlying conductive pattern.

26. The apparatus according to claim 21, wherein said imaging device images each of said conductive patterns directly on a photoresist layer with the imaging data of the respective pattern applied according to scanning control data for the respective pattern.

27. The apparatus according to claim 21, wherein said scanning means produces relative movement between an exposure head and the substrate along two orthogonal axes to scan the surface of the substrate for imaging the respective conductive pattern with the respective imaging data.

28. The apparatus according to claim 27, wherein said substrate holder is a flat holder.

29. The apparatus according to claim 28, wherein said exposure head includes one or more lasers.

30. The apparatus according to claim 28, wherein said flat holder is driven longitudinally, and said exposure head is driven transversely, under the control of said scanning control data to scan the surface of the substrate on said flat holder.

\* \* \* \* \*